United States Patent
Yoshio et al.

(10) Patent No.: US 7,888,849 B2
(45) Date of Patent: Feb. 15, 2011

(54) PIEZOELECTRIC RESONATOR AND METHOD FOR PRODUCING THE SAME

(75) Inventors: Masakazu Yoshio, Takaoka (JP); Koichi Yamasaki, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 550 days.

(21) Appl. No.: 11/829,411

(22) Filed: Jul. 27, 2007

(65) Prior Publication Data

US 2008/0048527 A1    Feb. 28, 2008

Related U.S. Application Data

(63) Continuation of application No. PCT/JP2006/301102, filed on Jan. 25, 2006.

(30) Foreign Application Priority Data

Feb. 1, 2005 (JP) .............................. 2005-025248

(51) Int. Cl.
*H01L 41/08* (2006.01)
(52) U.S. Cl. .................... 310/364; 310/312; 310/365
(58) Field of Classification Search ................ 310/364, 310/365, 312, 320
See application file for complete search history.

(56) References Cited

U.S. PATENT DOCUMENTS

| | | | | |
|---|---|---|---|---|
| 5,329,202 A | * | 7/1994 | Garlick et al. | 310/334 |
| 5,396,143 A | * | 3/1995 | Seyed-Bolorforosh et al. | 310/334 |
| 6,111,341 A | * | 8/2000 | Hirama | 310/365 |
| 7,098,758 B2 | * | 8/2006 | Wang et al. | 333/189 |
| 2005/0093397 A1 | * | 5/2005 | Yamada et al. | 310/320 |

FOREIGN PATENT DOCUMENTS

| | | |
|---|---|---|
| JP | 62-239707 | 10/1987 |
| JP | 11-41051 | 2/1999 |
| JP | 11-289236 | 10/1999 |
| JP | 2001-196883 | 7/2001 |
| JP | 2002-198759 | 7/2002 |
| JP | 2002-299982 | 10/2002 |
| JP | 2003-017776 | 1/2003 |
| JP | 2003-46364 | 2/2003 |
| JP | 2003-115741 | 4/2003 |

OTHER PUBLICATIONS

PCT/JP2006/301102, Written Opinion dated May 16, 2006.
PCT/JP2006/301102, International Search Report dated May 16, 2006.

* cited by examiner

*Primary Examiner*—Mark Budd
(74) *Attorney, Agent, or Firm*—Dickstein Shapiro LLP

(57) ABSTRACT

TO reduce frequency variations caused by a change in frequency constant and suppress unnecessary vibrations in the case where the frequency constant of apiezoelectric substrate has a gradient. A piezoelectric resonator has vibrating electrodes 4 and 5 facing each other, which are formed on two major surfaces of apiezoelectric substrate Ia, and trapped vibrations are generated between the two vibrating electrodes. The piezoelectric substrate Ia has a constant thickness. The frequency constant of the piezoelectric substrate Ia has a gradient in a surface direction. The vibrating electrodes 4 and 5 are formed to have a gradient thickness so that the thickness gradually increases as the frequency constant of the piezoelectric substrate increases. By forming the vibrating electrodes to have a gradient thickness, unnecessary in-band vibrations are suppressed, and frequency variations are reduced.

9 Claims, 7 Drawing Sheets

RELATIONSHIP BETWEEN GRADIENT THICKNESS - 3rd θ min

PIEZOELECTRIC RESONATOR AND METHOD FOR PRODUCING THE SAME

CROSS REFERENCE TO RELATED APPLICATIONS

The present application is a continuation of International Application No. PCT/JP2006/301102, filed Jan. 25, 2006, which claims priority to Japanese Patent Application No. JP2005-025248, filed Feb. 1, 2005, the entire contents of each of these applications being incorporated herein by reference in their entirety.

TECHNICAL FIELD

The present invention relates to a piezoelectric resonator which has vibrating electrodes facing each other formed on two major surfaces of a piezoelectric substrate and which is used to generate vibration strapped between the two vibrating electrodes, and a method for producing the same.

BACKGROUND ART

In general, the production of piezoelectric resonators involves baking, molding, and polarization of a piezoelectric substrate 1 serving as a mother substrate (unit), as shown in FIG. 11. An electrode 2 with a constant thickness is formed by sputtering or vapor deposition on the entire front and back main surfaces of the piezoelectric substrate 1, and a plurality of vibrating electrodes are then formed by etching or the like. The piezoelectric substrate 1 is cut according to the vibrating electrodes, thereby fabricating the individual piezoelectric resonators.

FIG. 12 shows the distribution of frequency constants after the polarization of the piezoelectric substrate 1 serving as the mother substrate. In FIG. 12, the frequency constant (MHz·μm) is F×t (F: resonant frequency MHz of the piezoelectric substrate, and t: thickness μm of the piezoelectric substrate). As shown in FIG. 12, the frequency constants around the center of the piezoelectric substrate 1 are substantially equal. However, the frequency constants along the periphery of the piezoelectric substrate 1 are higher than those around the center. It is also clear from the distribution that the frequency constants have a gradient that gradually increases toward the outer periphery. Thus, the resonant frequencies within one piezoelectric substrate 1 are greatly different, causing characteristic variations among the individual piezoelectric resonators obtained from the piezoelectric substrate 1.

For example, when a piezoelectric resonator having vibrating electrodes 2a and 2b with a constant thickness shown in FIG. 13(a) is fabricated by cutting it out from a peripheral portion of the piezoelectric substrate 1 where the gradient of frequency constant is great (portion A in FIG. 11), the frequency constant changes in a surface direction of a piezoelectric substrate 1a serving as a child substrate, as shown in FIG. 13(b). When vibrations are generated between the vibrating electrodes 2a and 2b disposed on the front and back surfaces of the piezoelectric substrate 1a, unnecessary in-band vibrations R in a symmetric mode are generated, as shown in FIG. 14, and desired resonance characteristics cannot be achieved. As a result, piezoelectric resonators cut out from the peripheral portion of the piezoelectric substrate 1 shown in FIG. 11 must be discarded, resulting in a reduction in the substrate utilization rate (yield).

Patent Document 1 discloses a piezoelectric component having a piezoelectric resonator including a planar piezoelectric substrate and a pair of exciting electrodes formed on a pair of front and back main surfaces of the piezoelectric substrate, a first resin layer formed on the main surface to cover the exciting electrode, and a second resin layer formed to surround the first resin layer, thereby precisely adjusting the resonant frequency and obtaining the piezoelectric resonance component with stable characteristics.

However, in Patent Document 1, only the first resin layer covering the exciting electrode and the second resin layer surrounding the first resin layer are formed. When a frequency constant varies in the piezoelectric substrate, the first resin layer and the second resin layer can not reduce the frequency variation or suppress unnecessary vibrations generated due to the gradient of frequency constant.

Patent Document 2 discloses a method of adjusting the frequency of a piezoelectric resonator prepared by forming first and second vibrating electrodes on front and back major surfaces of a piezoelectric substrate, in which the thickness of the first vibrating electrode is greater than the thickness of the second vibrating electrode. The method includes thinning the first vibrating electrode or thickening the second vibrating electrode so that the thicknesses of the first and second vibrating electrodes become closer to each other, thereby achieving a desired frequency.

This can suppress the generation of in-band ripples while adjusting the frequency to a desired value.

In Patent Document 2, each of the first and second vibrating electrodes is processed to have a similar thickness in a whole area. When a frequency constant varies in the piezoelectric substrate, a precise resonant frequency cannot be achieved. Unnecessary vibrations generated by the gradient of frequency constant of the piezoelectric substrate cannot be suppressed.

FIG. 5 of Patent Document 3 discloses a piezoelectric resonator having a wedge-shaped piezoelectric substrate whose thickness changes with a constant gradient and a pair of drive electrodes facing each other, which are provided on two major sloping surfaces of the piezoelectric substrate, in which the thickness of the drive electrodes gradually increases toward the thinnest portion of the piezoelectric substrate. In this case, the thickness of the drive electrodes is changed to compensate for the tapering (sloping surfaces) of the piezoelectric substrate. That is, the thickness of the drive electrodes is gradually increased toward the thinnest portion of the piezoelectric substrate so that the total thickness of the piezoelectric substrate and the drive electrodes is the same in the longitudinal direction. This design prevents effects such as ripples induced by the tapering shape from appearing in the impedance characteristics.

However, even when the piezoelectric substrate has a constant thickness, the gradient of frequency constant of the piezoelectric substrate is generated. In the method described in Patent Document 3 in which the thickness of the piezoelectric substrate is changed with a constant gradient while the thickness of the electrodes has a gradient in the opposite direction, unnecessary vibrations resulting from the gradient of frequency constant cannot be effectively suppressed.

Patent Document 1: Japanese Unexamined Patent Application Publication No. 11-41051

Patent Document 2: Japanese Unexamined Patent Application Publication No. 2001-196883

Patent Document 3: Japanese Unexamined Patent Application Publication No. 2003-46364

DISCLOSURE OF INVENTION

Problems to be Solved by the Invention

Accordingly, it is an object of the preferred embodiments of the present invention to provide a piezoelectric resonator for achieving a precise resonant frequency by reducing frequency variations caused by differences in frequency constant in the case of a piezoelectric substrate whose thickness is constant and whose frequency constant has a gradient, suppressing unnecessary vibrations generated by the gradient of frequency constant of the piezoelectric substrate, and achieving the stable resonant frequency, and a method of producing the same.

Means for Solving the Problems

In order to achieve the aforementioned object, a first preferred embodiment of the present invention provides a piezoelectric resonator having vibrating electrodes disposed on two main surfaces of a piezoelectric substrate, the piezoelectric resonator generating vibrations trapped between the two vibrating electrodes. The piezoelectric substrate has a constant thickness, and a frequency constant thereof has a gradient in a surface direction. The vibrating electrode disposed on at least one of the main surfaces of the piezoelectric substrate is formed to have a gradient thickness so that the thickness gradually increases as the frequency constant of the piezoelectric substrate increases.

A second preferred embodiment of the present invention provides a piezoelectric resonator producing method including the steps of: preparing a piezoelectric substrate serving as a polarized mother substrate, the piezoelectric substrate having a constant thickness, a frequency constant thereof being or almost constant in practical use at the center thereof and gradually increasing in the periphery thereof toward the outer periphery; forming electrodes on the entirety of two main surfaces of the piezoelectric substrate serving as the mother substrate to have a gradient thickness so that the thickness of the electrode disposed on at least one of the main surfaces of the piezoelectric substrate is constant at the center thereof and gradually increases in the periphery thereof toward the outer periphery as a frequency constant of the piezoelectric substrate increases; etching the electrodes to form individual vibrating electrodes facing each other; and cutting the piezoelectric substrate serving as the mother substrate into individual pieces with the vibrating electrodes, thereby obtaining piezoelectric resonators generating vibrations trapped between the two vibrating electrodes.

In the piezoelectric resonator according to the preferred embodiments of the present invention, the gradient of frequency constant of the piezoelectric substrate is measured in advance, and, according to this gradient, the vibrating electrodes are adjusted to have a gradient (sloping) thickness. That is, the vibrating electrodes are formed such that the thickness thereof gradually increases as the frequency constant increases. Accordingly, the gradient of frequency constant occurring in the piezoelectric substrate can be compensated for using the mass loading effect of the electrode thickness, thereby reducing variations in the resonant frequency of the piezoelectric substrate and suppressing unnecessary in-band vibrations (asymmetric mode) generated due to the gradient of frequency constant.

Vibrating electrodes with a gradient thickness may be formed on the two main surfaces of the piezoelectric substrate.

A vibrating electrode with a gradient thickness may be formed on one main surface of the piezoelectric substrate, and a vibrating electrode with a constant thickness may be formed on the other main surface of the piezoelectric substrate. However, vibrations of the vibrating electrodes will be better balanced and resonance characteristics will be improved by providing vibrating electrodes with a gradient thickness on the two main surfaces of the piezoelectric substrate.

Preferably, the vibrating electrode disposed on at least one of the main surfaces of the piezoelectric substrate has a laminated structure including a lower electrode with a constant thickness and an upper electrode disposed on the lower electrode, and the upper electrode has a gradient thickness.

The vibrating electrode with a gradient thickness may be implemented by a single-layer electrode. However, when an additional upper electrode with a gradient thickness is formed on a lower electrode with a constant thickness serving as a sufficient thickness as a vibrating electrode, the thickness of the upper electrode can be reduced. Accordingly, the vibrating electrode can be fabricated in a short period of time at low cost. Since the upper electrode with a gradient thickness needs to be formed only in necessary portions, frequency variations can be freely adjusted.

The lower and upper electrodes may be formed by thin film deposition such as sputtering or vapor deposition. The thickness of a gradient film can be controlled by varying the dimensions of an aperture of a film-deposition mask, the distance between a covering portion and the piezoelectric substrate, and film deposition conditions.

It is preferable that the upper electrode be formed of the same type of metal as that of the outermost layer of the lower electrode in order to improve adhesion therebetween.

The vibrating electrodes disposed on the two main surfaces of the piezoelectric substrate may have a laminated structure including a lower electrode with a constant thickness and an upper electrode disposed on the lower electrode, and the upper electrode may have a gradient thickness.

In this case, the thicknesses of the vibrating electrodes disposed on the two main surfaces are equivalent to each other. Thus, the piezoelectric resonator with excellent resonant characteristics can be obtained.

Vibrating electrodes with a gradient thickness may be disposed on the two main surfaces of the piezoelectric substrate. Let $t1-t2$ be the difference in thickness between the thickest portion and the thinnest portion of each of the vibrating electrodes, and L be the length of each of the vibrating electrodes, then, it is preferable that the thickness gradient ratio $(t1-t2)/L$ of each of the vibrating electrodes be 0.05 to 0.20.

When the thickness gradient ratio of each of the vibrating electrodes is set to 0.05 to 0.20, variations in the center frequency can be reduced to 0.15% or less, and ripples caused by unnecessary in-band vibrations can be reduced.

The piezoelectric resonator can be obtained by preparing a piezoelectric substrate serving as a polarized mother substrate, forming electrodes on the entirety of two main surfaces of the piezoelectric substrate, etching the electrodes to form individual vibrating electrodes facing each other, and cutting the piezoelectric substrate serving as the mother substrate into individual pieces with the vibrating electrodes.

The piezoelectric substrate serving as the polarized mother substrate has a constant thickness. A frequency constant of the piezoelectric substrate is constant or almost constant in practical use at the center thereof and gradually increases in the periphery thereof toward the outer periphery. This is due to the difference between the polarization degree in the periphery and the polarization degree at the center in a polarization process. The polarization degree distribution is substantially even at the center and gradually increases in the periphery toward the outer periphery.

Information of electrodes on the entirety of two main surfaces of the piezoelectric substrate, the electrode disposed on at least one of the main surfaces of the piezoelectric substrate is formed to have a gradient thickness so that the thickness thereof is constant at the center thereof and gradually increases in the periphery thereof toward the outer periphery as a frequency constant of the piezoelectric substrate increases. The electrodes are etched, and the piezoelectric substrate serving as the mother substrate is cut into individual pieces, thereby obtaining piezoelectric resonators. In other words, the gradient of frequency constant of the piezoelectric substrate serving as the mother substrate is compensated for by the gradient of the thickness of the electrode. As a result, piezoelectric resonators cut out from the center of the piezoelectric substrate and piezoelectric resonators cut out from the periphery of the piezoelectric substrate have substantially uniform resonance characteristics, and hence frequency variations are reduced.

As a method of forming an electrode with a gradient thickness, a method of sputtering the piezoelectric substrate serving as the mother substrate using a mask covering the center of the piezoelectric substrate with a predetermined gap therebetween while leaving the periphery of the piezoelectric substrate open can be used.

In general, no electrode is formed in a portion covered by the mask. However, when there is a gap between the mask and the piezoelectric substrate, some of metal atoms forming the electrodes are introduced to the back of the mask, thereby forming the electrodes with a gradient thickness. Also, the electrodes facing the aperture of the mask may have a gradient thickness. By adjusting the gap between the mask and the piezoelectric substrate, the gradient of the thickness of the electrodes can be adjusted.

ADVANTAGES OF THE PREFERRED EMBODIMENTS OF THE INVENTION

As has been described above, according to the preferred embodiments of the present invention, the vibrating electrodes have a gradient thickness according to the gradient of frequency constant of the piezoelectric substrate. This reduces variations in the resonant frequency of the piezoelectric substrate and suppresses unnecessary in-band vibrations generated due to the gradient of frequency constant. Accordingly, the range of the piezoelectric substrate serving as one mother substrate in which stable resonators are fabricated with precision is increased, and the substrate utilization rate is thereby increased. As a result, the production cost of the piezoelectric resonators can be reduced.

BEST MODE FOR CARRYING OUT THE INVENTION

Preferred embodiments of the present invention will be described with reference to the embodiments.

Embodiment 1

FIG. 1(a) shows a first embodiment of a piezoelectric resonator according to the present invention. The piezoelectric resonator is an energy-trapped piezoelectric resonator in a thickness-longitudinal vibration mode.

The piezoelectric resonator includes a rectangular piezoelectric substrate 1a formed of a piezoelectric ceramic, such as a lead zirconate titanate ceramic or a lead titanate ceramic. The piezoelectric substrate 1a is polarized in a thickness direction. The resonant frequency of the piezoelectric resonator depends on its thickness. When the thickness is 0.475 mm, the resonant frequency is 16 MHz.

Figure 13:
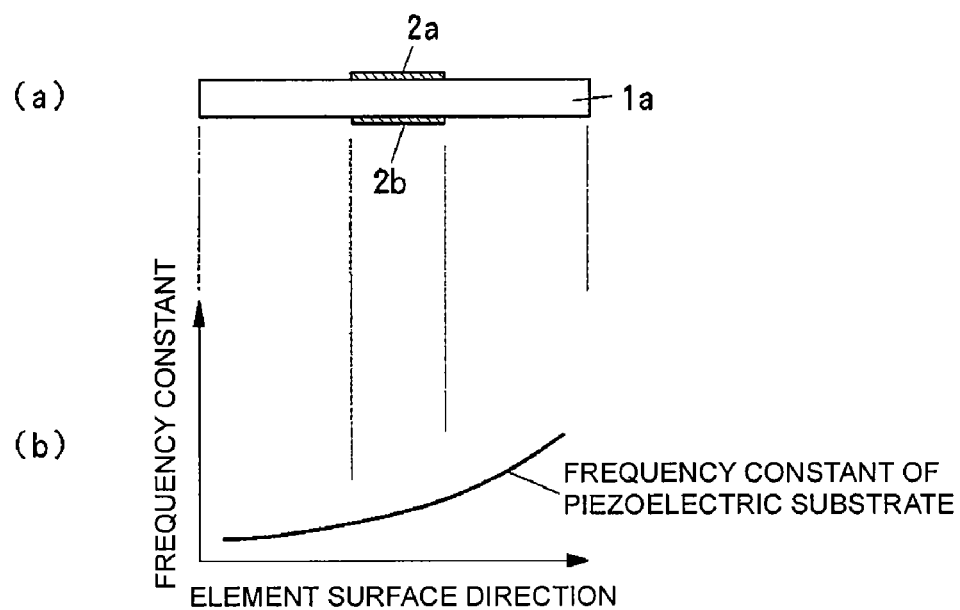
FIG. 13 includes a cross-sectional view of the known piezoelectric resonator and a diagram showing changes in frequency constant in the surface direction.

Vibrating electrodes 4 and 5 facing each other are formed at the center of front and back surfaces of the piezoelectric substrate 1a. Although not shown in FIG. 1, extraction electrodes extracted from the vibrating electrodes 4 and 5 to the periphery of the piezoelectric substrate 1a and terminal electrodes are formed on the front and back surfaces of the piezoelectric substrate 1a. The vibrating electrodes 4 and 5 have a laminated structure including lower electrodes 2a and 2b and upper electrodes 3a and 3b, respectively. The shape and thickness of the lower electrodes 2a and 2b are the same as those of vibrating electrodes of a known piezoelectric resonator (see FIG. 13). That is, each of the lower electrodes 2a and 2b has the same thickness in a whole area. The lower electrodes 2a and 2b are made of a material such as Ag, Cu, Al, Pd, Au, or the like. To enhance the adhesion to the piezoelectric substrate (ceramic), the lower electrodes 2a and 2b may have a layer lying there beneath, which is made of an alloy of Ni, Cr, and the like. It is preferable that the upper electrodes 3a and 3b be made of the same material as that of the lower electrodes 2a and 2b.

As shown in FIG. 1(b), the frequency constant of the piezoelectric substrate 1a gradually changes from a first side to a second side. In accordance with this change, the thickness of the upper electrodes 3a and 3b gradually changes. That is, as shown in FIG. 1(a), the thickness of the upper electrodes 3a and 3b is set so that the thickness gradually increases as the frequency constant increases. Let t1 be the thickness of the thickest portion of each of the upper electrodes 3a and 3b, t2 be the thickness of the thinnest portion of each of the upper electrodes 3a and 3b, and L be the length of each of the upper electrodes 3a and 3b. Then, the thickness gradient ratio of each of the upper electrodes 3a and 3b is set to $(t1-t2)/L=0.05$ to 0.20. The thickness of the lower electrodes 2a and 2b is constant. By setting the thickness of each of the vibrating electrodes 4 and 5 so that the thickness has a gradient, the frequency gradient occurring in the piezoelectric substrate 1a is compensated for using the mass loading effect of the electrode thickness.

Figure 1:
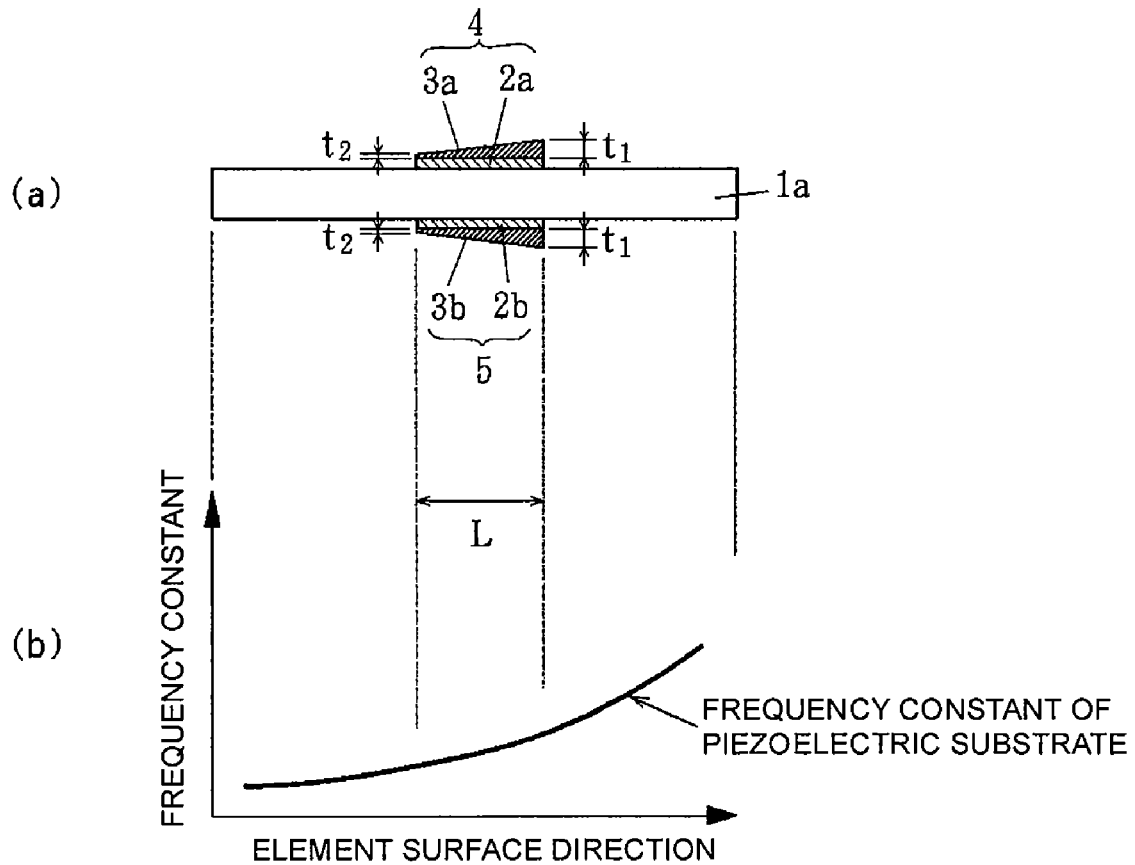
FIG. 1 includes a cross-sectional view of a first embodiment of a piezoelectric resonator according to the present invention and a diagram showing changes in frequency constant in a surface direction.
Figure 2:
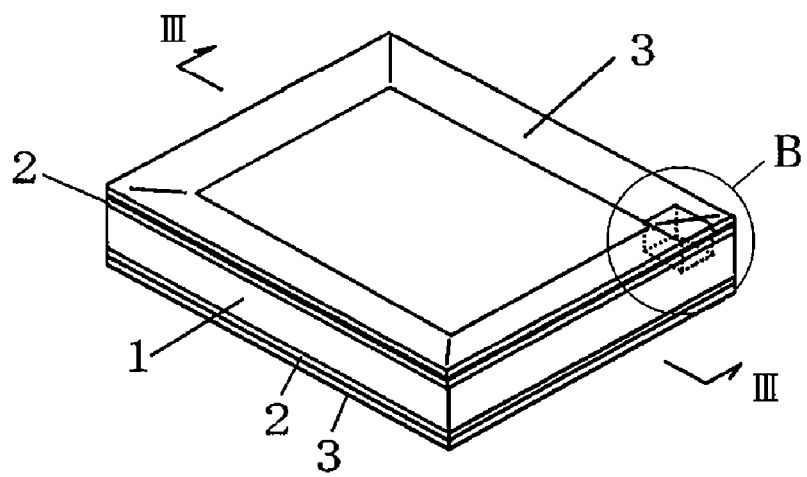
FIG. 2 is a perspective view of a piezoelectric substrate serving as a mother substrate on which electrodes are formed to fabricate the piezoelectric resonator shown in FIG. 1.
Figure 3:
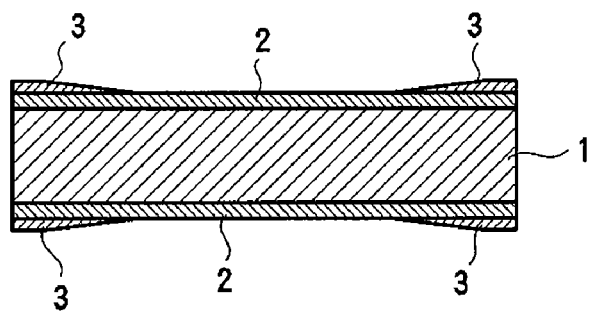
FIG. 3 is a cross-sectional view taken along the line III-III of FIG. 2.

FIGS. 2 and 3 show a piezoelectric substrate 1 serving as a mother substrate for fabricating the piezoelectric resonator shown in FIG. 1.

The piezoelectric substrate 1 is shaped as a rectangular plate with dimensions of, for example, 30 mm×20 mm×0.475 mm and is baked, molded, and polarized. The polarization condition is, for example, application of 8 kV/mm for 30 minutes in oil at 60° C. The distribution of frequency constants of the piezoelectric substrate 1 is the same as that shown in FIG. 12. Lower electrodes 2 are formed on the entirety of top and bottom surfaces of the piezoelectric substrate 1. Upper electrodes 3 are formed along the periphery above the lower electrodes 2 in which the frequency constant has a gradient. In particular, the upper electrodes 3 are formed to have a gradient thickness so that the upper electrodes 3 gradually thicken toward the outer periphery thereof. The lower and upper electrodes 2 and 3 are formed by sputtering or vapor deposition.

Figure 4:
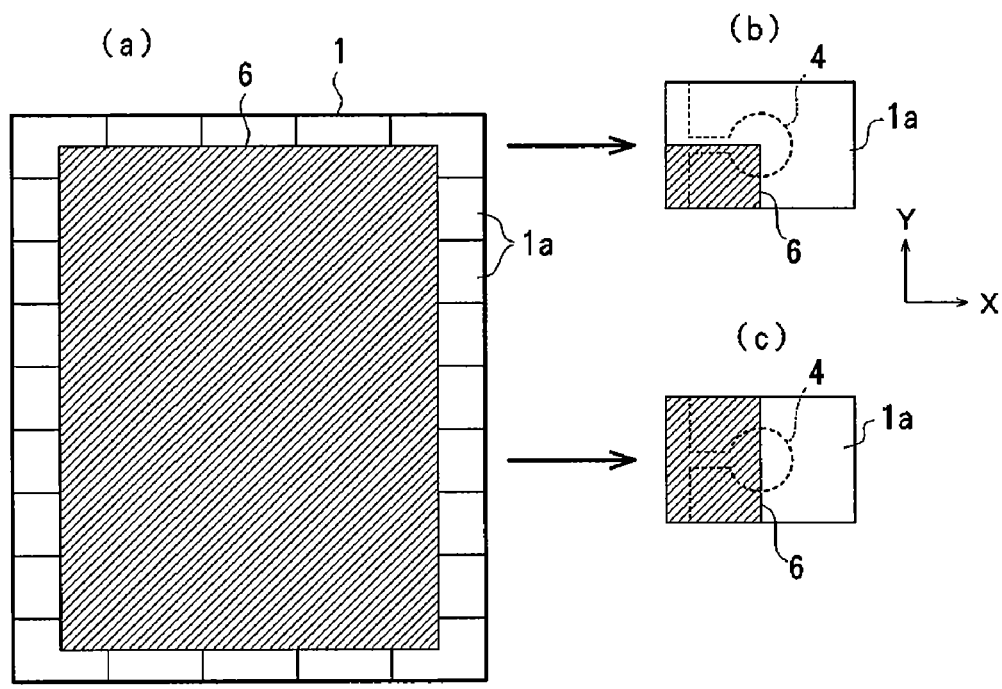
FIG. 4 includes diagrams for illustrating states in which individual resonators are cut out from the piezoelectric substrate serving as the mother substrate.
Figure 5:
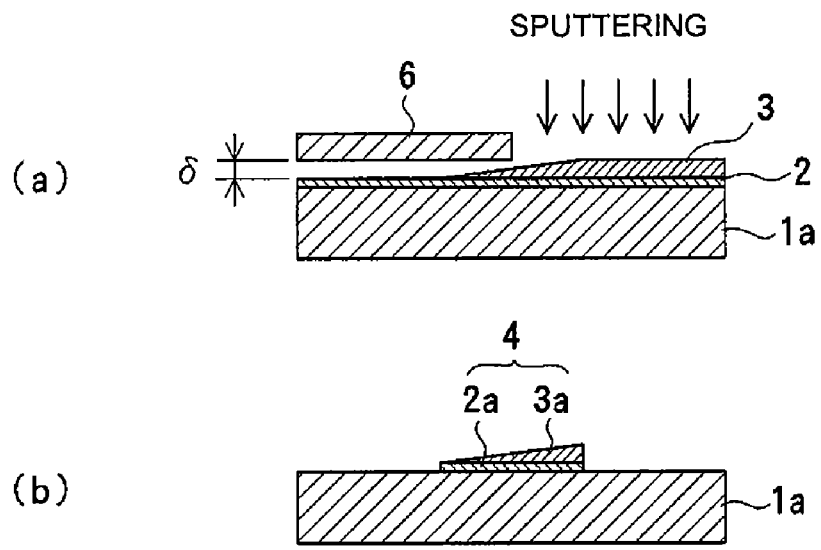
FIG. 5 includes cross-sectional views of one piece taken from a peripheral portion for showing a method of forming an electrode whose thickness has a gradient.

FIGS. 4 and 5 show a sputtering technique for processing the piezoelectric substrate 1. FIG. 5 shows one piezoelectric resonator taken from the periphery of the piezoelectric substrate 1.

From the piezoelectric substrate 1, for example, 9×5 pieces of piezoelectric resonators can be obtained. A mask 6 is positioned so as to cover the piezoelectric substrate 1 from the center thereof to the middle of each of the piezoelectric resonators in the periphery thereof. There is a gap 6 between the mask 6 and the piezoelectric substrate 1. Some of metal atoms sputtered are introduced to the back of the mask 6, thereby forming each of the electrodes 3 with a gradient thickness. In FIG. 5(a), not only the thickness of a portion of the electrode 3 covered with the mask 6, but also the thickness of a portion of the electrode 3 exposed outside and near the mask 6 has a gradient due to differences in irradiation. By adjusting the gap 6 between the mask 6 and the piezoelectric substrate 1, the dimensions of an aperture of the mask 6, the film deposition conditions, and the like, the gradient of the thickness and the range in which gradient electrodes are formed can be adjusted.

As shown in FIG. 4(b), among the piezoelectric resonators cut out from the piezoelectric substrate 1, one cut out from the corner of the piezoelectric substrate 1 has a frequency constant with a gradient in the X and Y directions. Thus, the thickness of an electrode sputtered by covering one corner with the mask 6 has a gradient in the X and Y directions.

As shown in FIG. 4(c), among the piezoelectric resonators cut out from the piezoelectric substrate 1, one cut out from one side of the piezoelectric substrate 1 has a frequency constant with a gradient in the X direction. Thus, the thickness of an electrode sputtered by covering one side with the mask 6 has a gradient in the X direction.

Although the vibrating electrodes are partially masked in FIGS. 4(b) and (c), the thickness of the vibrating electrodes has a gradient substantially in its entirety, as shown in FIG. 3(a).

FIG. 5(b) shows a state after the sputtering in which the vibrating electrode 4 is formed by etching. Although only one vibrating electrode 4 disposed on one side of the piezoelectric substrate 1a is shown in FIG. 5, the vibrating electrode 5 on the other side is formed in a similar manner.

Figure 6:
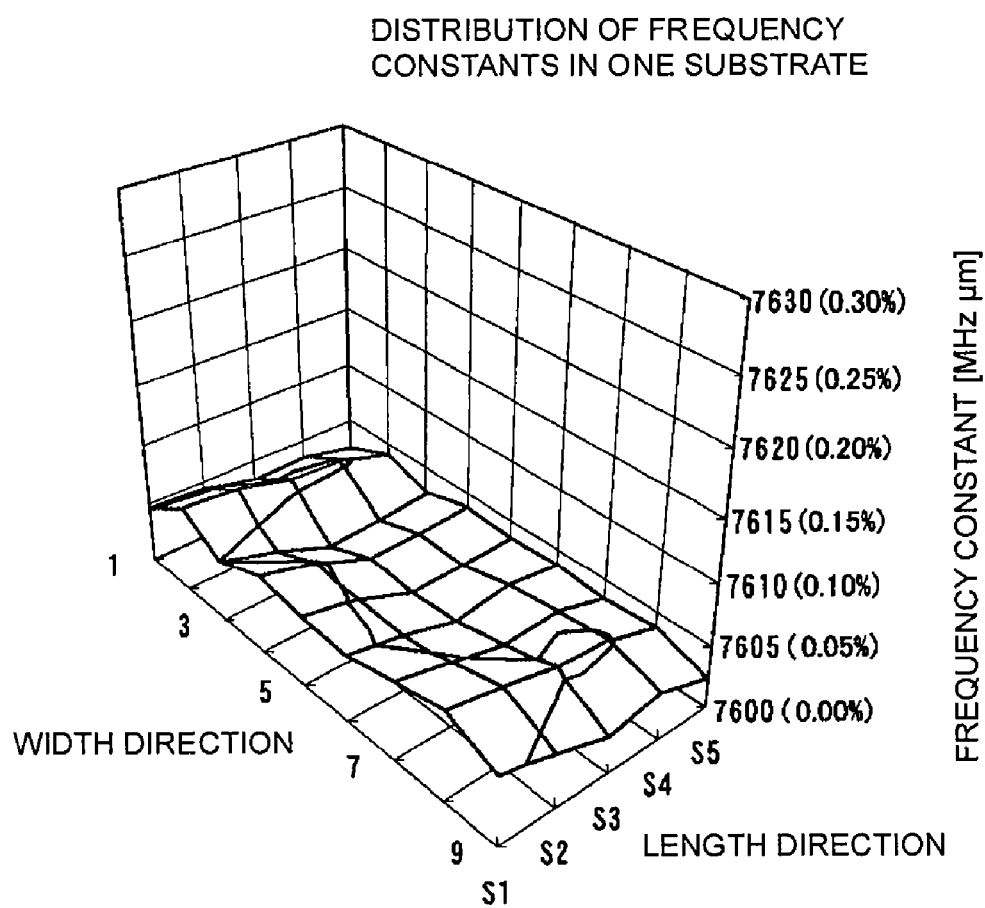
FIG. 6 is a diagram showing the distribution of frequency constants of the piezoelectric substrate on which the electrodes shown in FIG. 2 are formed.

FIG. 6 shows the distribution of frequency constants in the piezoelectric substrate 1 on which the above-described electrodes 2 and 3 are formed.

Figure 12:
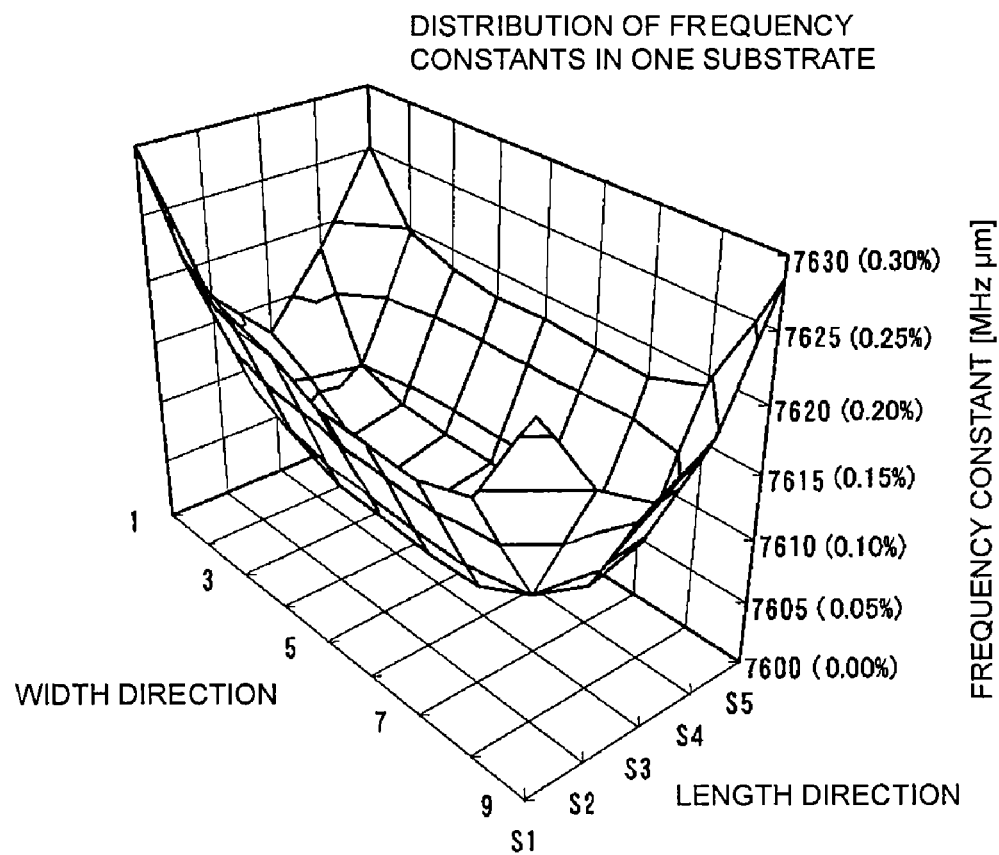
FIG. 12 is a diagram showing the distribution of frequency constants of the piezoelectric substrate on which the electrodes shown in FIG. 11 are formed.

As is clear from the comparison between FIGS. 6 and 12, differences in frequency constant between the center and the periphery of the piezoelectric substrate 1 are greatly reduced by forming the upper electrodes 3 whose thickness has a gradient. In this case, the upper electrodes 3 are formed into a rectangular frame along the periphery of the piezoelectric substrate 1, thereby suppressing variations in the frequency constant of the piezoelectric substrate 1 to 0.1% or less.

After the formation of the electrodes 2 and 3 on the piezoelectric substrate 1 in the above-described manner, a plurality (e.g., 45 pieces) of vibrating electrodes 4 and 5 are formed on the piezoelectric substrate 1 using an electrode pattern. The general formation method involves printing, etching, or the like. Thereafter, the piezoelectric substrate 1 is cut into pieces of, for example, 3.7×3.1 mm, thereby obtaining the piezoelectric resonators. The piezoelectric resonator shown in FIG. 1 is cut out from portion B shown in FIG. 2.

Since the piezoelectric resonator cut out from the center of the piezoelectric substrate 1 shown in FIG. 2 has a frequency constant with no gradient, only the lower electrodes 2a and 2b are formed, and no upper electrodes 3a and 3b are formed.

Figure 7:
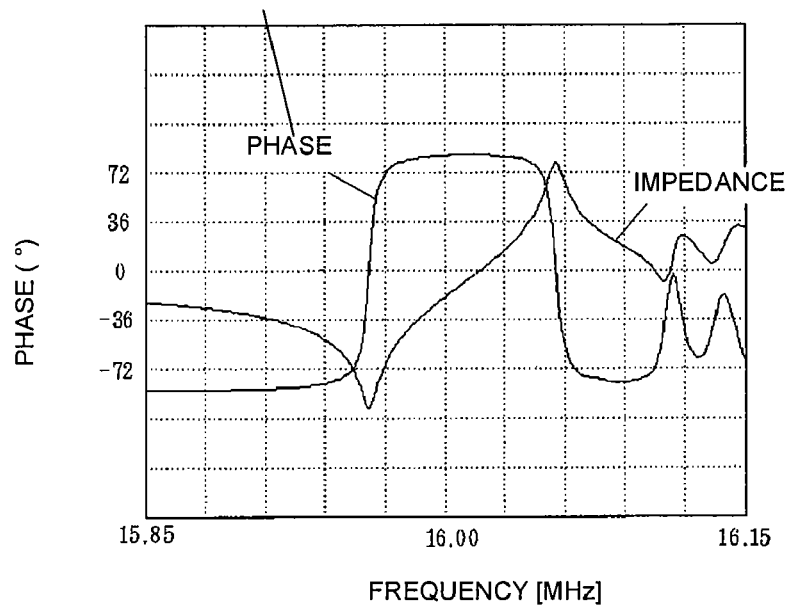
FIG. 7 is a diagram showing the impedance characteristics and the phase characteristics of the piezoelectric resonator shown in FIG. 1.

FIG. 7 shows the impedance characteristics and the phase characteristics of the piezoelectric substrate 1a shown in FIG. 1.

Figure 14:
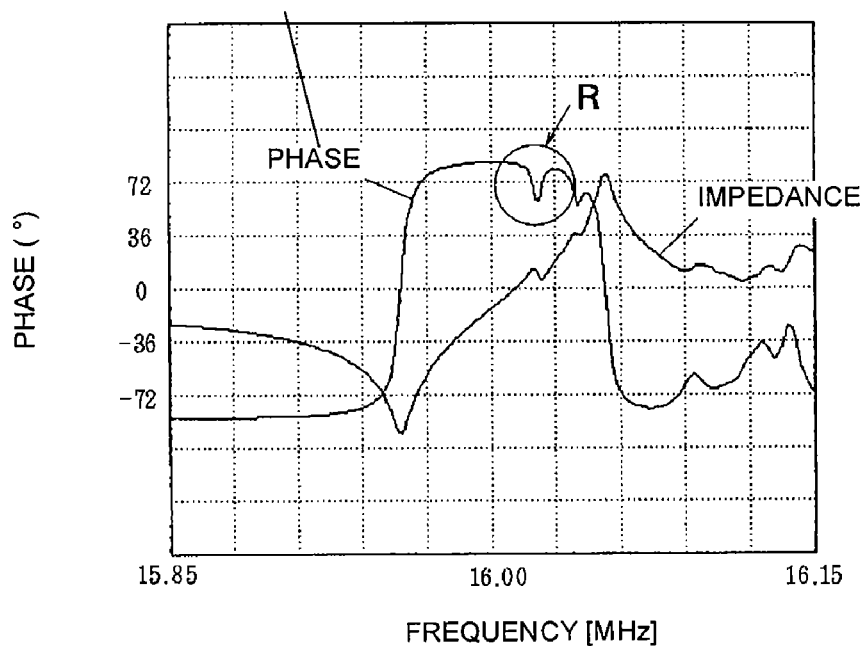
FIG. 14 is a diagram showing the impedance characteristics and the phase characteristics of the piezoelectric resonator shown in FIG. 13.

As is clear from the comparison with FIG. 14, unnecessary in-band vibrations (asymmetric mode) generated due to the gradient of frequency constant are eliminated.

Figure 8:
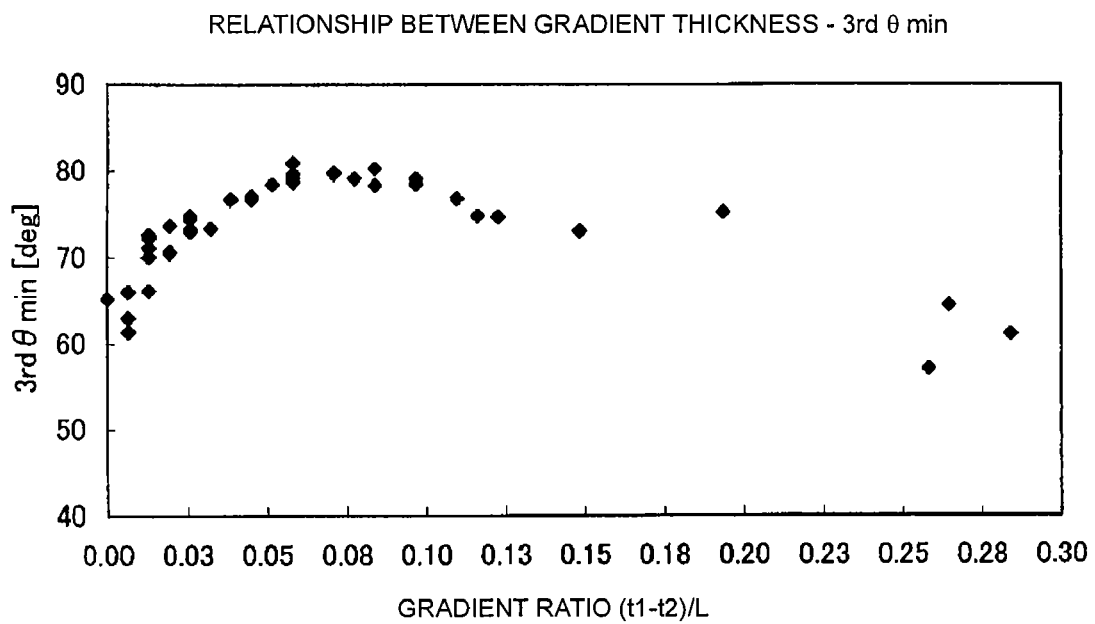
FIG. 8 is a diagram showing the relationship between the thickness gradient ratio (t1−t2)/L of each vibrating electrode and 3rd θ min.

FIG. 8 shows the relationship between the thickness gradient ratio $(t1-t2)/L$ and 3rd θ min, in which 3rd θ min denotes the minimum phase in the frequency band in which oscillation can be generated by using the third harmonic. Within the frequency band shown in FIG. 14, 3rd θ min is the minimum phase of ripple R caused by unnecessary vibrations.

In the case of the gradient ratio $(t1-t2)/L=0$, that is, in the case of a known structure with no gradient, the ripple minimum value is about 60 deg. In contrast, when the gradient ratio $(t1-t2)/L$ is 0.05 to 0.20, the ripple minimum value is 70 deg or greater, thereby suppressing unnecessary vibrations.

Figure 9:
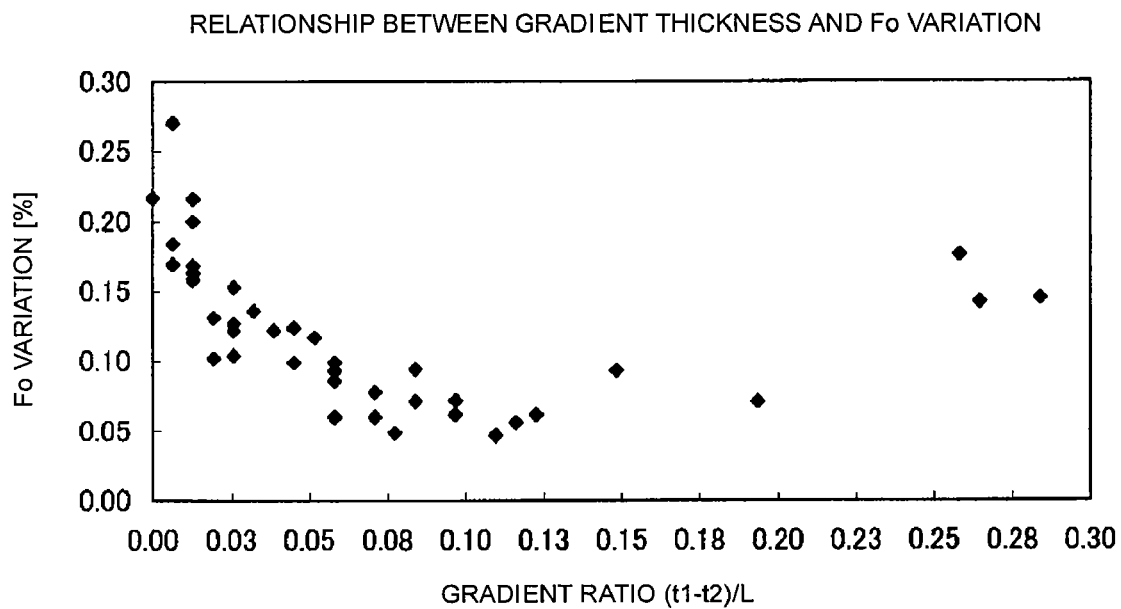
FIG. 9 is a diagram showing the relationship between the thickness gradient ratio (t1−t2)/L of the vibrating electrode and Fo variation.

FIG. 9 is a diagram showing the relationship between the thickness gradient ratio $(t1-t2)/L$ and Fo variation, in which Fo variation denotes a variation at the midpoint between the resonant frequency and the anti-resonant frequency of the piezoelectric substrate 1.

In the case of the gradient ratio $(t1-t2)/L=0$, the Fo variation is about 0.20%. In contrast, when $(t1-t2)/L$ is 0.05 to 0.20, the Fo variation can be reduced to about 0.12% or less.

The above results show that the gradient thickness of the vibrating electrodes can advantageously suppress unnecessary in-band vibrations and reduce frequency variations.

Embodiment 2

Figure 10:
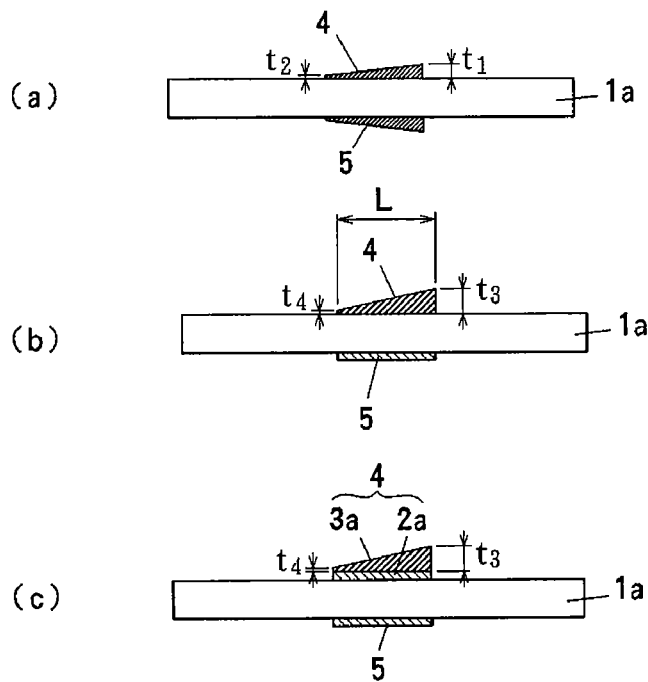
FIG. 10 includes cross-sectional views showing the structure of another embodiment of the piezoelectric resonator according to the present invention.
Figure 11:
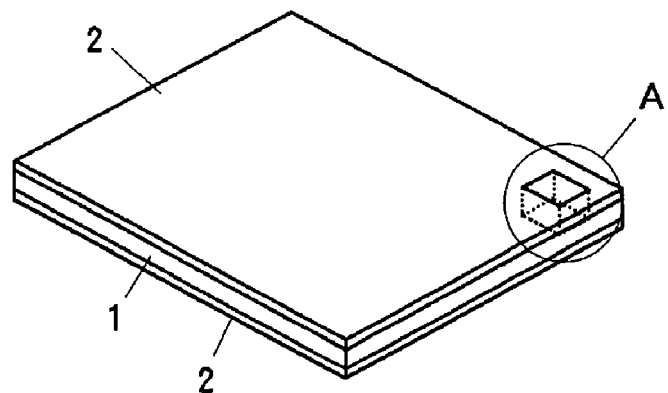
FIG. 11 is a perspective view showing a piezoelectric substrate serving as a mother substrate on which electrodes are formed to fabricate a known piezoelectric resonator.

FIGS. 10(a) to (c) show another embodiment of electrode structures of the piezoelectric resonator according to the present invention.

FIG. 10(a) shows the case in which the vibrating electrodes 4 and 5 with a gradient thickness have a single-layer structure. As a layer underlying the vibrating electrodes 4 and 5, an alloy layer formed of Ni, Cr, and the like may be used to enhance the adhesion to the piezoelectric substrate (ceramic).

FIG. 10(b) shows the case in which the vibrating electrode 4 disposed on the front surface has a gradient thickness, whereas the vibrating electrode 5 disposed on the back surface has a constant thickness. In this case, let t3 be the thickness of the thickest portion of the vibrating electrode 4 disposed on the front surface, t4 be the thickness of the thinnest portion of the vibrating electrode 4, and L be the length of the vibrating electrode 4. Then, it is preferable that the thickness gradient ratio (t3−t4)/L=0.10 to 0.40. That is, the gradient must be doubled compared with the case in which the vibrating electrodes disposed on the two surfaces have a gradient thickness.

FIG. 10(c) shows the case in which the vibrating electrode 4 disposed on the front surface has a laminated structure including the lower electrode 2a with a constant thickness and the upper electrode 3a with a gradient thickness, and the vibrating electrode 5 disposed on the back surface has a constant thickness. In this case, as in FIG. 10(b), the thickness gradient ratio is doubled compared with the case in which the vibrating electrodes disposed on the two surfaces have a gradient thickness.

Similar advantages to those achieved in the first embodiment can be achieved by any of these electrode structures.

Although the piezoelectric resonator in a thickness-expansion vibration mode has been described in the above embodiments, the present invention is not limited thereto. For example, the present invention is applicable to piezoelectric resonators in other vibration modes such as thickness-shear vibration mode or thickness-expansion vibration mode as long as the piezoelectric resonators can generate trapped vibrations.

When the vibrating electrodes with a gradient thickness are formed on the two main surfaces of the piezoelectric substrate, as shown in FIG. 1 and FIG. 10(a), the thicknesses of the two main surfaces have the same gradient. However, both may be different from each other. Since the present invention compensates for the gradient of frequency constant of the piezoelectric substrate using the mass loading effect of the electrode thickness, the total thickness of the vibrating electrodes disposed on the two main surfaces may have a gradient in accordance with the gradient of frequency constant.

The invention claimed is:

1. A piezoelectric resonator having vibrating electrodes disposed on two main surfaces of a piezoelectric substrate, the piezoelectric resonator generating vibrations trapped between the two vibrating electrodes,
wherein the piezoelectric substrate has a constant thickness, and a frequency constant thereof has a gradient in a surface direction, and
wherein the vibrating electrode disposed on at least one of the main surfaces of the piezoelectric substrate is in the form of a sloping plane having a thickness that gradually increases in a direction that the frequency constant of the piezoelectric substrate increases.

2. The piezoelectric resonator according to claim 1, wherein vibrating electrodes with a gradient thickness are formed on the two main surfaces of the piezoelectric substrate.

3. The piezoelectric resonator according to claim 1, wherein the vibrating electrode disposed on at least one of the main surfaces of the piezoelectric substrate has a laminated structure including a lower electrode with a constant thickness and an upper electrode disposed on the lower electrode, and wherein the upper electrode has a gradient thickness.

4. The piezoelectric resonator according to claim 1, wherein the vibrating electrodes disposed on the two main surfaces of the piezoelectric substrate have a laminated structure including a lower electrode with a constant thickness and an upper electrode disposed on the lower electrode, and wherein the upper electrode has a gradient thickness.

5. The piezoelectric resonator according to claim 1, wherein vibrating electrodes with a gradient thickness are disposed on the two main surfaces of the piezoelectric substrate, and, $t1-t2$ is the difference in thickness between the thickest portion and the thinnest portion of each of the vibrating electrodes, and L is the length of each of the vibrating electrodes, then, the thickness gradient ratio $(t1-t2)/L$ of each of the vibrating electrodes is 0.05 to 0.20.

6. The piezoelectric resonator according to claim 1, wherein $t1-t2$ is a difference in thickness between a thickest portion and a thinnest portion of the vibrating electrode disposed on at least one of the main surfaces of the piezoelectric substrate, and L is the length of the vibrating electrode, then, a thickness gradient ratio $(t1-t2)/L$ of the vibrating electrode is 0.10 to 0.40.

7. The piezoelectric resonator according to claim 3, wherein $t1-t2$ is a difference in thickness between a thickest portion and a thinnest portion of the upper electrode, and L is the length of the upper electrode, then, the thickness gradient ratio $(t1-t2)/L$ of the upper electrode is 0.10 to 0.40.

8. The piezoelectric resonator according to claim 1, wherein $t1-t2$ is a difference in thickness between a thickest portion and a thinnest portion of the vibrating electrode disposed on at least one of the main surfaces of the piezoelectric substrate, and L is the length of the vibrating electrode, then, a thickness gradient ratio $(t1-t2)/L$ of the vibrating electrode is 0.05 to 0.20.

9. The piezoelectric resonator according to claim 1, wherein the vibrating electrode disposed on at least one of the main surfaces of the piezoelectric substrate has a portion with a constant thickness.

* * * * *